US008066530B2

(12) United States Patent  
Masucci et al.

(10) Patent No.: US 8,066,530 B2  
(45) Date of Patent: Nov. 29, 2011

(54) PORTABLE ASSEMBLY HAVING A SUBSCRIBER IDENTIFICATION MODULE

(75) Inventors: Christopher M. Masucci, Des Moines, IA (US); Kenneth C. Clark, Ankeny, IA (US); David M. Thompson, Hope, ND (US); Michael A. Hajicek, West Fargo, ND (US); Todd A. Braun, Fargo, ND (US); Christopher J. Schmit, Fargo, ND (US)

(73) Assignee: Deere & Company, Moline, IL (US)

( * ) Notice: Subject to any disclaimer, the term of this patent is extended or adjusted under 35 U.S.C. 154(b) by 389 days.

(21) Appl. No.: 12/425,497

(22) Filed: Apr. 17, 2009

(65) Prior Publication Data

US 2010/0265672 A1 Oct. 21, 2010

(51) Int. Cl.  
*H01R 9/09* (2006.01)
(52) U.S. Cl. .............. 439/620.22; 439/620.21
(58) Field of Classification Search ............. 439/620.22, 439/620.21  
See application file for complete search history.

(56) References Cited

U.S. PATENT DOCUMENTS

| | | | |
|---|---|---|---|
| 4,932,885 A | 6/1990 | Scholz | |
| 6,175,517 B1 | 1/2001 | Jigour et al. | |
| 6,431,902 B1 | 8/2002 | Yeh | |
| 6,808,396 B2 | 10/2004 | Kawaguchi et al. | |
| 6,816,386 B2 | 11/2004 | Oguchi et al. | |
| 6,902,435 B1 | 6/2005 | Cheng | |
| 6,976,879 B2 | 12/2005 | Shishikura et al. | |
| 7,006,349 B2 | 2/2006 | Nuovo et al. | |
| 7,114,659 B2 | 10/2006 | Harari et al. | |
| 7,118,419 B1 | 10/2006 | Lee | |
| 7,341,198 B2 | 3/2008 | Nishizawa et al. | |
| 7,448,914 B2 | 11/2008 | Calvas et al. | |
| 7,510,444 B2 | 3/2009 | Chang et al. | |
| 7,789,691 B2 | 9/2010 | Li et al. | |
| 2002/0055291 A1 | 5/2002 | Maiterth et al. | |
| 2003/0186587 A1* | 10/2003 | Kao et al. | 439/620 |
| 2005/0108571 A1 | 5/2005 | Lu et al. | |
| 2005/0245136 A1 | 11/2005 | Yin et al. | |
| 2006/0291483 A1 | 12/2006 | Sela | |
| 2007/0127220 A1 | 6/2007 | Lippert et al. | |
| 2009/0068893 A1* | 3/2009 | Busse et al. | 439/620.22 |
| 2009/0069048 A1 | 3/2009 | Yang | |
| 2009/0124126 A1 | 5/2009 | Cho et al. | |
| 2009/0253301 A1* | 10/2009 | Chang et al. | 439/620.22 |

FOREIGN PATENT DOCUMENTS

EP 0965937 12/1999  
EP 1602058 12/2005

* cited by examiner

*Primary Examiner* — Gary F. Paumen

(57) ABSTRACT

The assembly has a subscriber identification module comprising a housing with a recess disposed in the housing. An electrical connector portion is secured to the housing. The connector portion comprises a dielectric body and connector terminals. A subscriber identification module is housed in the housing, where the subscriber identification module has device terminals. A conductor or flexible substrate electrically connects the connector terminals to the device terminals. A protective filler overlies the subscriber identification module and at least part of the conductor or the flexible substrate.

9 Claims, 1 Drawing Sheet

PORTABLE ASSEMBLY HAVING A SUBSCRIBER IDENTIFICATION MODULE

FIELD OF THE INVENTION

This invention relates to a portable assembly having a subscriber identification module.

BACKGROUND OF THE INVENTION

Subscriber identification modules are used in wireless transceivers to assign unique identifiers for each subscriber or user of the wireless transceiver. Further, the subscriber identification module may be associated with a network service provider or a wireless access provider or the level of service available for a particular subscriber. Accordingly, there is need for a portable assembly having a subscriber identification module for reliably adding a subscriber identification module to a wireless device or transceiver, consistent with resistance to shock, vibration, and thermal stress.

SUMMARY OF THE INVENTION

In accordance with one embodiment, the assembly comprises a housing with a recess disposed in the housing. A first connector portion is secured to the housing. The first connector portion comprises a dielectric body and connector terminals. A subscriber identification module is housed in the housing, where the subscriber identification module has device terminals. A conductor or flexible substrate electrically connects the connector terminals to the device terminals. A protective filler overlies the subscriber identification module and at least part of the conductor or the flexible substrate.

DESCRIPTION OF THE PREFERRED EMBODIMENT

Figure 1A:
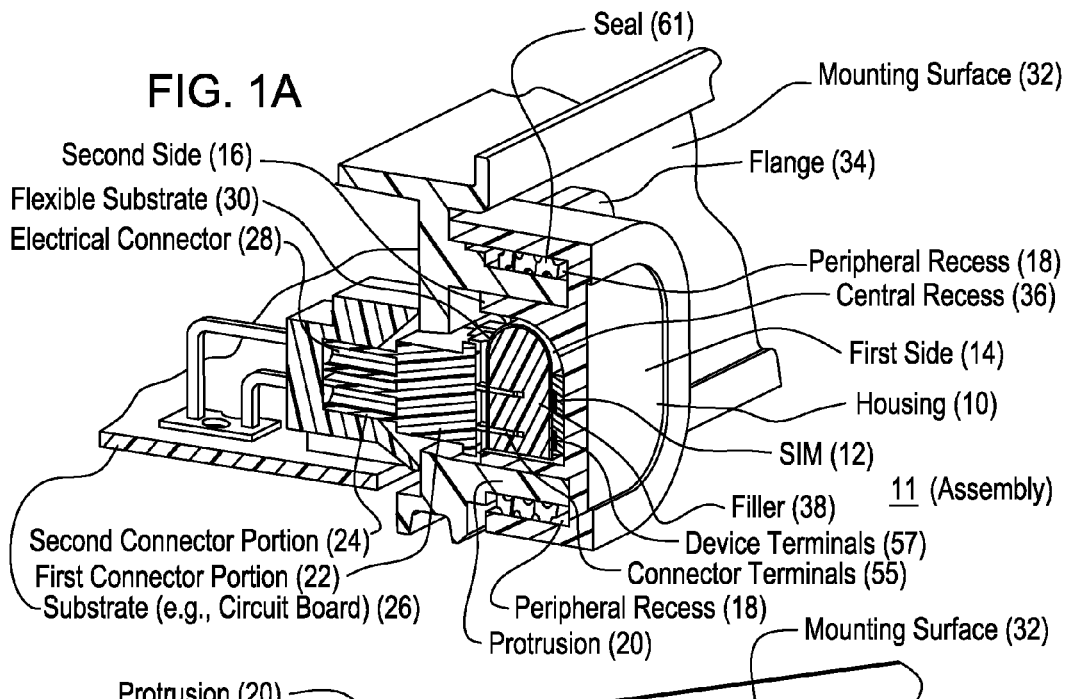
FIG. 1A is a cross sectional perspective view of a first embodiment of an assembly having a subscriber identification module.
Figure 1B:
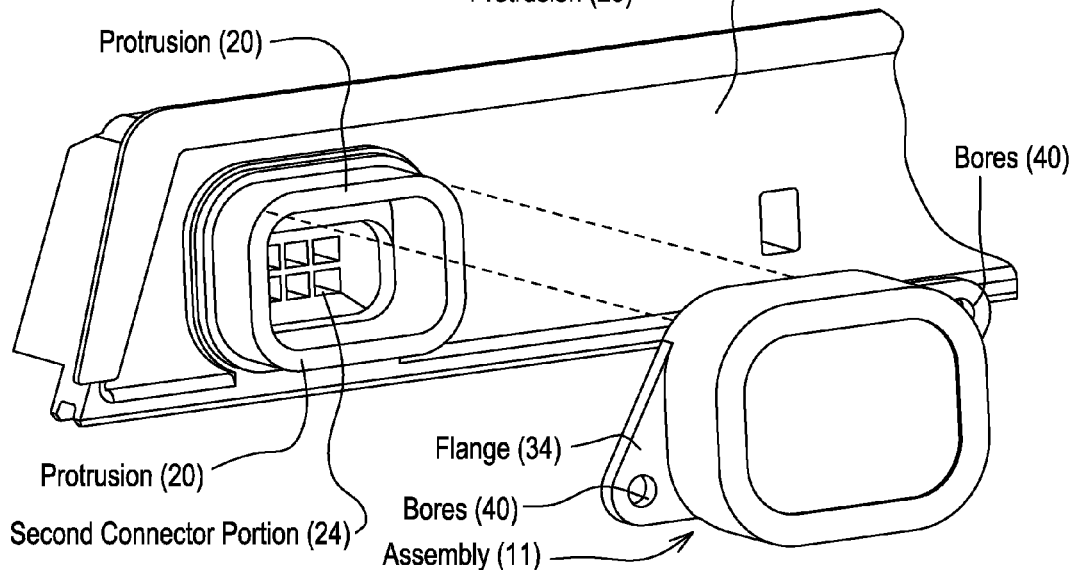
FIG. 1B is an exploded perspective view of the first embodiment of the assembly in accordance with FIG. 1A.
Figure 1C:
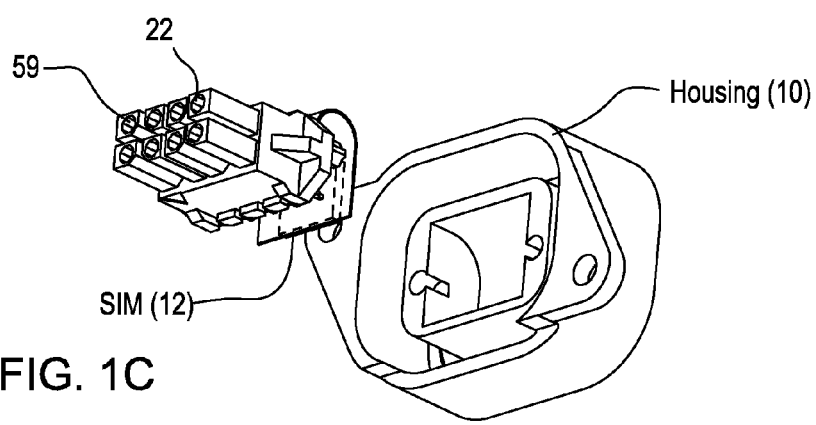
FIG. 1C is another exploded perspective view of the first embodiment of an assembly in accordance with FIG. 1A.

In accordance with a first embodiment of the assembly 11, FIG. 1A, FIG. 1B and FIG. 1C, illustrate a housing 10 having a first side 14 and a second side 16. A central recess 36 is disposed within the housing 10 on the second side 16. At least a portion of an electrical connector 28 is secured to the housing 10. The electrical connector 28 has connector terminals 55. A subscriber identification module (SIM) 12 is located within the housing 10 in the central recess 36. The subscriber identification module 12 has device terminals 57. A conductor or flexible substrate 30 electrically connects the connector terminals 55 to the device terminals 57. A protective filler 38 overlies or contacts the subscriber identification module 12 and at least part of the conductor or flexible substrate 30. For example, the protective filler 38 is located in or fills (completely or partially) what would otherwise be an air volume in the central recess 36.

The housing 10 includes a first side 14 and a second side 16 opposite the first side 14. In the second side 16, there is a central recess 36 and a peripheral recess 18 surrounding the central recess 36. The housing 10 further comprises a flange 34 for securing the housing 10 and the assembly 11 to a mounting surface 32, for example. The housing 10 secures a first connector portion 22 via a fastener, adhesive bonding, a press fit, or other mechanical retention mechanism (e.g., spring loaded ring or compression spring in a slot).

The electrical connector 28 comprises a first connector portion 22 that mates with a second connector portion 24. Each connector portion (22, 24) comprises a dielectric body and conductors having connector terminals 55 and mating terminals. The mating terminals 59 of the first connector portion 22 physically contact and electrically contact the mating terminals of the second connector portion 24 to allow the reliable transmission of electrical signals within the voltage and current ratings of the connector. In one embodiment, the electrical connector 28 supports a group of connector terminals for a subscriber identification module. For example, the group of connector terminals may comprise one or more of the following: a reset input terminal, a clock input terminal, a ground terminal, a clock output terminal, a data input terminal, a data output terminal, and power input. The input and output terminals may be arranged for serial input or output of digital signal levels, for example. Although FIG. 1A illustrates the second connector portion 24 as a surface mount device mounted on substrate 26 (e.g., a circuit board), different configurations of the connector and the second connector portion 24 may be used including surface mount, through-hole mounting, or otherwise.

The subscriber identification module (SIM 12) comprises an electronic device that is capable of communication with a wireless transceiver or terminal. In one embodiment, the SIM 12 comprises electronic memory (e.g., nonvolatile random access memory) and a card interface circuit (e.g., logic circuit) for wireless transceivers or terminals. For example, the SIM 12 may comprise a smart card that supports storage and retrieval of user data. The SIM 12 device may facilitate storage of user data, such as a user identifier, user location, user subscriber number (e.g., phone number) or user electronic address, network authorization data, user contact lists, stored text messages, user security data, and user passwords. The SIM 12 device may provide a personality to the associated electronics device based on the data stored within the SIM 12, where the personality tailors the electronics device to particular user preferences, particular user data, particular user settings, a particular selection of user programmable features, or particular functionality.

The SIM 12 is associated with a group of device terminals 57. For example, the group of device terminals 57 may comprise one or more of the following: a reset input terminal, a clock input terminal, a ground terminal, a clock output terminal, a data input terminal, a data output terminal, and power input.

In one embodiment, the SIM 12 is mounted on an interior wall of the central recess 36 and the volume between the SIM 12 and the first connector portion 22 is filled with a filler 38. The SIM 12 may be adhesively bonded or secured to the central recess 36 or on an interior wall of the central recess 36. The housing 10 provides a rigid shell that protects the SIM 12 from mechanical or environmental damage on one side, and the filler 38 dampens vibrations. In one exemplary embodiment, the filler 38 may comprise an elastomer, resilient polymer or other resilient material to dampen vibration. In another exemplary embodiment, the filler 38 may comprise ceramic particles in an elastomeric matrix or polymeric matrix to promote heat dissipation from the SIM 12 device.

Conductors 30 (e.g., of a flexible substrate) electrically connect the connector terminals 55 to the device terminals 57.

In one embodiment, the conductors are formed integrally in or on a flexible dielectric substrate 30. The combination of the flexible dielectric substrate 30 and the conductors may comprise a flexible circuit board. A flexible circuit board generally comprises a flexible or pliable dielectric layer with one or more conductive traces (e.g., metallic traces) on one or more sides. In one embodiment, the flexible dielectric substrate 30 may be formed of polyamide or a similar polymer or plastic material. The conductive traces may be formed by electrodeposition, adhesively bonded metallic foil, adhesively bonded conductive wire, wire molded or buried in the substrate 30 by application of heat, pressure, or otherwise.

In an alternate embodiment, the conductor may comprise one or more of the following: wires, insulated wires, a cable, a multi-conductor cable, twisted pairs of wire, or the like that are adhesively bonded to the flexible dielectric substrate 30.

The conductors, the flexible substrate 30, or both support some movement of the SIM 12, where the SIM 12 is mounted, partially or entirely, in the filler 38 to provide vibration dampening and vibration reduction of the filler 38. Accordingly, the assembly 11 fosters reliability because the conductors or flexible substrate 30 or flexible circuit board is capable of movement in a manner that supports dampening of movement of the SIM 12 by the filler 38.

The assembly 11 is capable of mounting on a mounting surface 32 with a protrusion 20 that mates with or engages a peripheral recess 18 in the housing 10. In one embodiment, the protrusion 20 aligns the first connector portion 22 and the second connector portion 24 for interlocking engagement. A seal 61 may be placed in the peripheral recess 18 to hermetically seal the assembly 11 to the mounting surface 32 of an electronic device. The combination of the protrusion 20, the peripheral recess 18 and the seal 61 provide protection against the environment, including salt, fog, moisture, and vibration. In one embodiment, the seal 61 comprises an elastomer (e.g., an O-ring), a resilient polymer or resilient plastic material. The flange 34 supports attachment to the mounting surface 32 via one or more fasteners. For example, in one configuration, the housing 10 has one or more bores 40 that support attachment of the assembly 11 via one or more fasteners.

The manufacturing process for the assembly 11 of FIG. 1A may be carried out as follows. First, the electrical connector 28 or the first connector portion 22 is soldered, fused or electrically connected to one end of the flexible substrate 30 and then the SIM 12 is soldered, fused or electrically connected to the other end of the flexible substrate 30. Second, the SIM 12 may be glued or adhesively connected to an interior wall of the central recess 36. Third, the SIM 12 may be potted or the recess filled with a filler 38, as previously described.

Having described the preferred embodiment, it will become apparent that various modifications can be made without departing from the scope of the invention as defined in the accompanying claims.

The following is claimed:

1. An electrical assembly comprising:
   a housing;
   a central recess disposed within the housing;
   a first connector portion secured to the housing, the first connector portion comprising a dielectric body and connector terminals;
   a subscriber identification module in the central recess within the housing, the subscriber identification module having device terminals;
   a plurality of conductors for electrically connecting the connector terminals to the device terminals, the conductors formed integrally in or on a flexible dielectric substrate; and
   a filler overlying the subscriber identification module and contacting at least part of the flexible dielectric substrate.

2. The assembly according to claim 1 wherein the first electrical connector portion comprises a plug or a socket.

3. The assembly according to claim 1 wherein the device terminals comprise conductive pads.

4. The assembly according to claim 1 wherein the filler comprises one or more of the following: a polymer, a plastic an elastomer, an adhesive and a potting compound.

5. The assembly according to claim 1 further comprising:
   a substrate; and
   a secondary connector portion for mating with the first connector portion, the secondary connector portion mounted to the substrate.

6. The assembly according to claim 1 further comprising:
   a peripheral recess around a periphery of a second side of the housing opposite a first side of the housing;
   a seal within the peripheral recess for preventing the ingress of dirt, debris, salt, water, moisture, or other foreign material.

7. The assembly according to claim 6 further comprising:
   a mounting surface having a generally annular protrusion for interlocking with the peripheral recess.

8. The assembly according to claim 1 wherein the generally annular protrusion aligns the first connector portion and the second connector portion for interlocking engagement.

9. The assembly according to claim 1 wherein the housing further comprises a flange extending around at least part of the perimeter of the housing, the flange having bores for receiving fasteners for fastening the assembly to a mounting surface.

\* \* \* \* \*